US011791186B2

(12) United States Patent
Harasaki

(10) Patent No.: US 11,791,186 B2
(45) Date of Patent: Oct. 17, 2023

(54) CONVEYANCE SYSTEM

(71) Applicant: MURATA MACHINERY, LTD., Kyoto (JP)

(72) Inventor: Kazumi Harasaki, Inuyama (JP)

(73) Assignee: MURATA MACHINERY, LTD., Kyoto (JP)

(*) Notice: Subject to any disclaimer, the term of this patent is extended or adjusted under 35 U.S.C. 154(b) by 643 days.

(21) Appl. No.: 16/982,611

(22) PCT Filed: Jan. 30, 2019

(86) PCT No.: PCT/JP2019/003248
§ 371 (c)(1),
(2) Date: Sep. 21, 2020

(87) PCT Pub. No.: WO2019/230046
PCT Pub. Date: Dec. 5, 2019

(65) Prior Publication Data
US 2021/0057250 A1 Feb. 25, 2021

(30) Foreign Application Priority Data
May 31, 2018 (JP) ................. 2018-105012

(51) Int. Cl.
H01L 21/677 (2006.01)
B65G 1/04 (2006.01)
(52) U.S. Cl.
CPC ...... H01L 21/67727 (2013.01); B65G 1/0485 (2013.01); H01L 21/67724 (2013.01);
(Continued)

(58) Field of Classification Search
CPC ......... H01L 21/67727; H01L 21/67724; H01L 21/67733; B65G 1/0485; B65G 2201/0297; B65G 2203/0283
See application file for complete search history.

(56) References Cited

U.S. PATENT DOCUMENTS 8,996,161 B2* 3/2015 Wernersbach .......... B61L 27/04
700/229
9,336,684 B2* 5/2016 Harasaki .............. G05D 1/0289
(Continued)

FOREIGN PATENT DOCUMENTS

JP 4366663 B2 11/2009

Primary Examiner — Michael Collins
(74) Attorney, Agent, or Firm — KEATING & BENNETT, LLP

(57) ABSTRACT

A transport system includes a track, transport vehicles, an area controller, buffers, and a host controller. The area controller, when a number of the transport vehicles present within a control area is a predetermined number and when receiving a first transport command to convey an article from a transfer port to a transport destination outside the control area from the host controller, stores the first transport command and transmits a report that the first transport command is not able to be assigned to the transport vehicle to the host controller. The host controller, when receiving the report, when the buffer is present, transmits a command to delete the stored first transport command to the area controller, generates a second transport command to convey the article from the transfer port to the buffer, and transmits the second transport command to the area controller.

6 Claims, 8 Drawing Sheets

(52) U.S. Cl.
CPC ............... *H01L 21/67733* (2013.01); *B65G 2201/0297* (2013.01); *B65G 2203/0283* (2013.01)

(56) References Cited

U.S. PATENT DOCUMENTS

| | | | |
|---|---|---|---|
| 10,354,902 B2* | 7/2019 | Honda | H01L 21/677 |
| 10,919,709 B2* | 2/2021 | Mattern | B25J 9/1612 |
| 11,339,008 B2* | 5/2022 | Takahara | B65G 47/5104 |
| 11,513,534 B2* | 11/2022 | Harasaki | G05D 1/0212 |
| 2003/0230941 A1* | 12/2003 | Jacobs | B65G 47/841 |
| | | | 310/12.19 |
| 2009/0000505 A1 | 1/2009 | Shimamura et al. | |
| 2015/0203298 A1* | 7/2015 | Matsumoto | B65G 13/02 |
| | | | 198/572 |
| 2015/0303841 A1* | 10/2015 | Suzuki | B65G 35/06 |
| | | | 318/38 |
| 2019/0329987 A1* | 10/2019 | Meschenmoser | B24B 41/005 |

\* cited by examiner

Fig.3
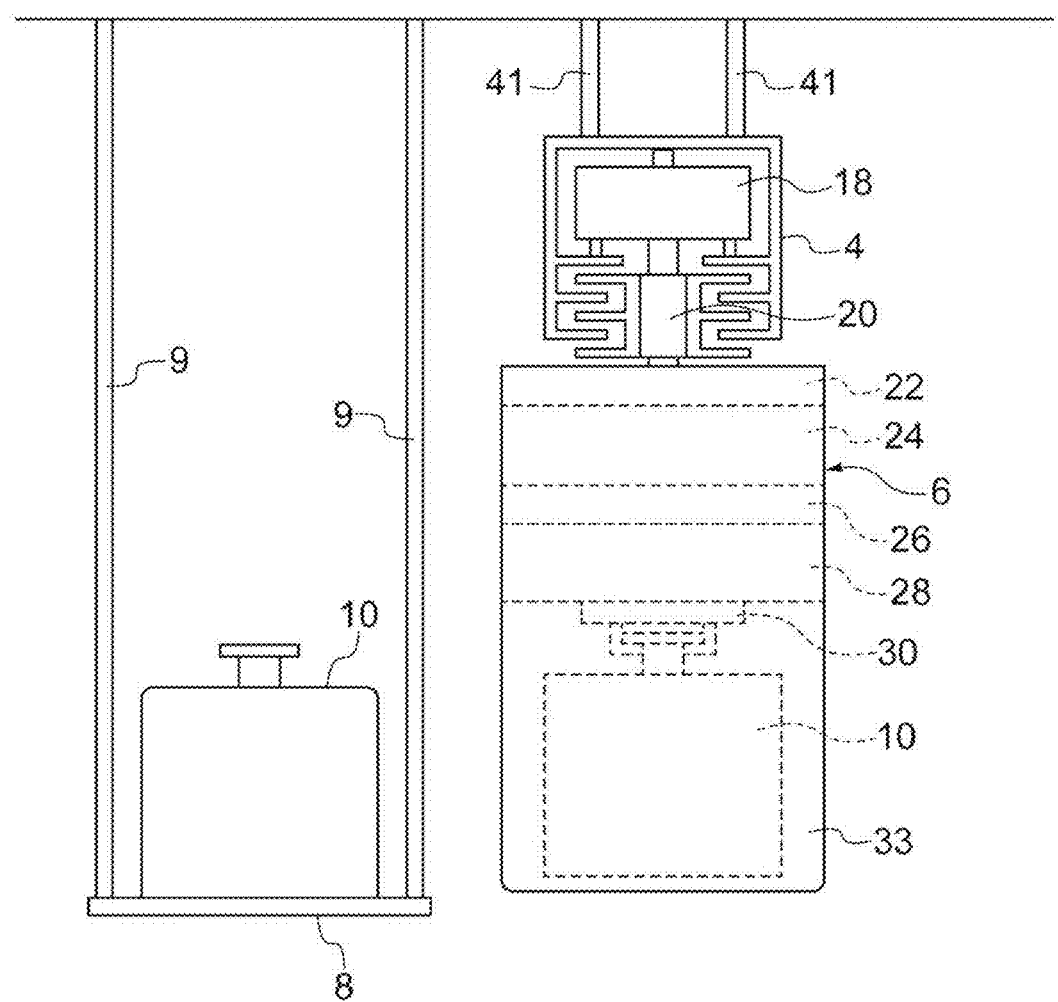
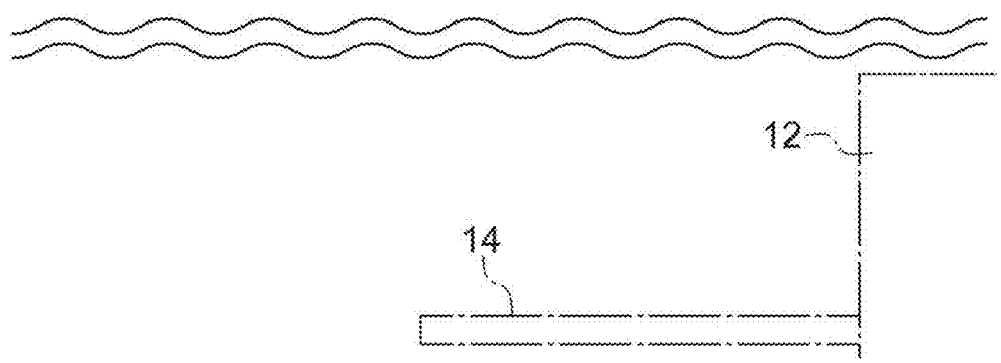

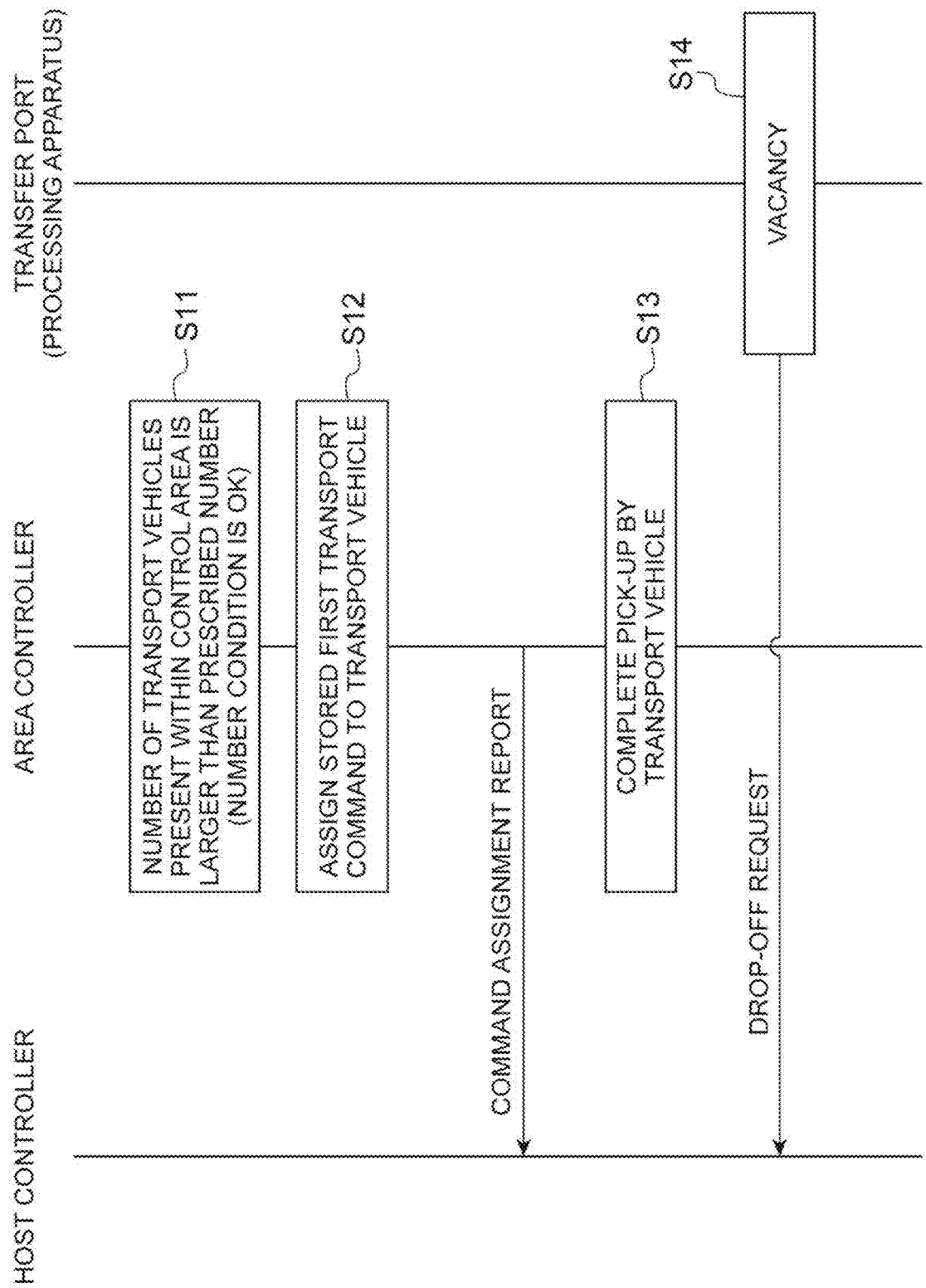

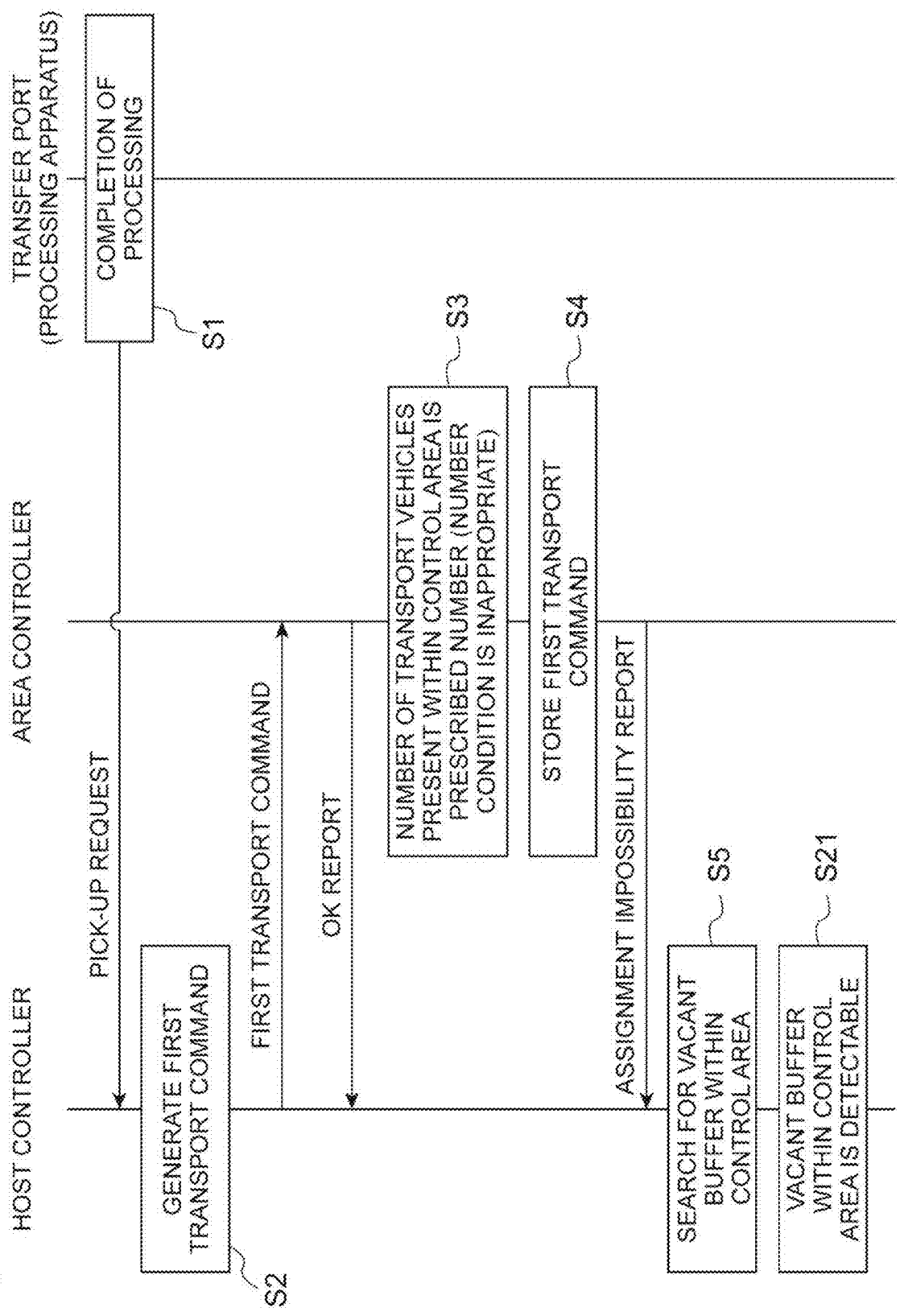

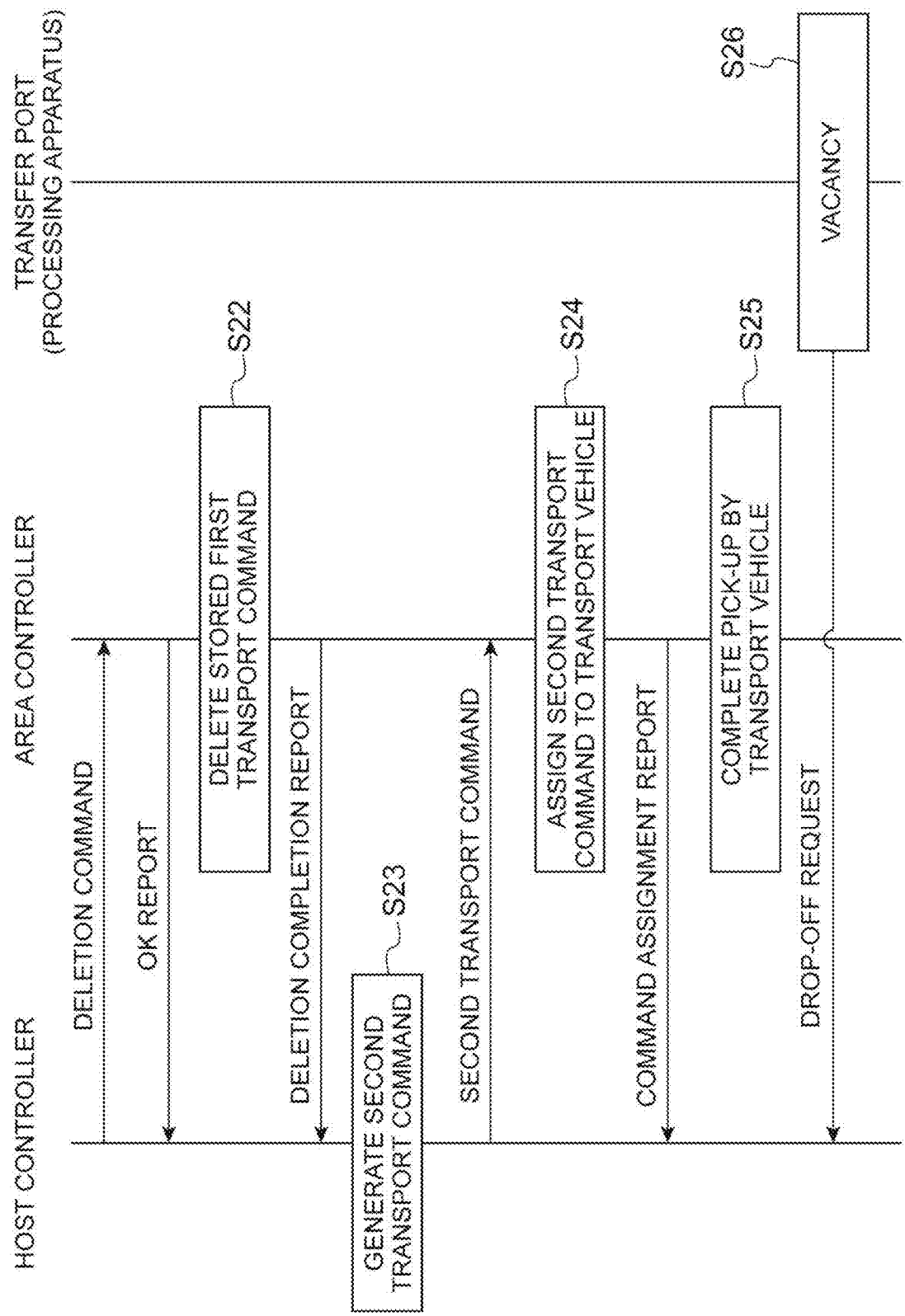

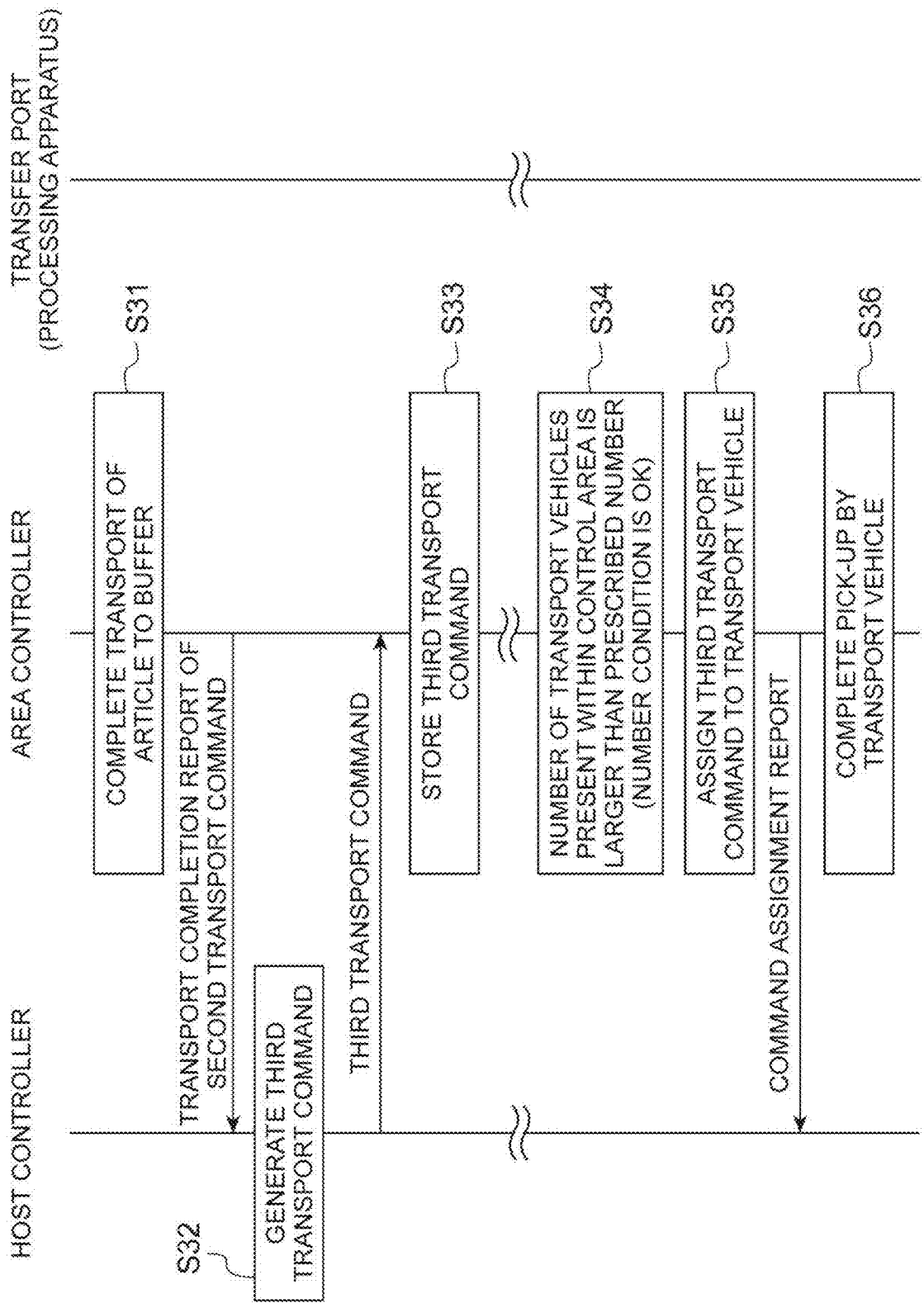

CONVEYANCE SYSTEM

BACKGROUND OF THE INVENTION

1. Field of the Invention

The present invention relates to a transport system.

2. Description of the Related Art

A conventional transport system includes a track extending over a plurality of areas, a plurality of transport vehicles traveling along the track, an area controller having any of the areas as a control area and controlling the transport vehicles within the control area, and a host controller transmitting a transport command to the area controller (refer to Japanese Patent No. 4366663, for example). Such a transport system is provided with buffers on which an article is temporarily placed at positions to and from which a transport vehicle can transfer the article.

In the transport system described above, when the number of the transport vehicles within the control area is a prescribed number, even when the area controller receives a first transport command for conveying the article from a transfer port of the article for a processing apparatus within the control area (hereinafter, also referred to simply as a "transfer port") to a transport destination outside the control area, the area controller returns rejection (NG: No Good) to the host controller without storing therein the first transport command as a command to be managed by itself. Upon the return of rejection, the host controller generates a second transport command for conveying the article from the transfer port to the buffer within the control area and transmits this second transport command to the area controller. Thus, the number of the transport vehicles present within the control area is avoided from becoming less than the prescribed number. However, in this situation, when the buffer that can place thereon the article (hereinafter, also referred to as a "vacant buffer") is not present, the second transport command is not generated, and the first transport command is managed by neither the host controller nor the area controller. Consequently, the article may be left at the transfer port.

In this regard, the host controller may constantly monitor the buffers and generate the second transport command when the vacant buffer occurs. However, in this case, a processing load on the host controller increases.

SUMMARY OF THE INVENTION

Preferred embodiments of the present invention provide transport systems with each of which an article is able to be prevented from being left at a transfer port while significantly reducing a processing load on a host controller.

A transport system according to a preferred embodiment of the present invention includes a track extending over a plurality of areas, a plurality of transport vehicles to travel along the track, an area controller including any of the areas as a control area and configured or programmed to control the plurality of transport vehicles within the control area, a buffer provided at a position to and from which one of the plurality of transport vehicles within the control areas is able to transfer an article and on which the article is temporarily placed, and a host controller configured or programmed to transmit to the area controller a transport command to cause the one of the plurality of transport vehicles to convey the article. The area controller is configured or programmed to, when a number of the plurality of transport vehicles present within the control area is a predetermined number set in advance and when receiving a first transport command to convey the article from a transfer port of the article for a processing apparatus within the control area to a transport destination outside the control area from the host controller, store the first transport command and transmit a report that the first transport command is not able to be assigned to the one of the plurality of transport vehicles to the host controller, and the host controller is configured or programmed to, when receiving the report from the area controller, when the buffer that is able to place the article is present, transmit a command to delete the stored first transport command to the area controller, generate a second transport command to convey the article from the transfer port to the buffer, and transmit the second transport command to the area controller.

In a transport system according to a preferred embodiment of the present invention, when the number of the transport vehicles present within the control area of the area controller is the predetermined number, if the vacant buffer is present, the first transport command is deleted in the area controller, and the second transport command is transmitted to the area controller by the host controller. On the other hand, if the vacant buffer is not present, the first transport command remains stored in the area controller. Thus, while the number of the transport vehicles present within the control area is prevented from becoming less than the predetermined number, the command to convey the article from the transfer port within the control area is able to be managed by either the host controller or the area controller regardless of the presence or absence of the vacant buffer within the control area, and thus the host controller does not need to constantly monitor the vacant buffer. Accordingly, the article is able to be prevented from being left at the transfer port while significantly reducing a processing load on the host controller.

In a transport system according to a preferred embodiment of the present invention, the area controller, when storing the first transport command, when the number of the transport vehicles present within the control area is larger than the predetermined number and the transport vehicle to which the transport command is able to be assigned is present within the control area, may assign the first transport command to the transport vehicle. Thus, when the buffer that is able to place thereon the article is not present, the area controller continuously manages the first transport command and waits for an increase in the number of the transport vehicles within the control area, and the article is able to be conveyed from the transfer port to the transport destination outside the control area.

In a transport system according to a preferred embodiment of the present invention, the area controller may assign the second transport command received from the host controller to the transport vehicle, and the host controller, when transport of the article to the buffer is completed by the transport vehicle to which the second transport command has been assigned, may generate a third transport command to convey the article from the buffer to a transport destination in the first transport command or another transport destination outside the control area and transmit the third transport command to the area controller. Thus, the article is conveyed to the buffer within the control area, and then the article is able to be conveyed from the buffer to the transport destination in the first transport command or the other transport destination outside the control area. That is, the second transport command or the third transport command is able to control the transport vehicle to execute transport of the article that was designated to have been executed by the transport vehicle by the first transport command or transport of the article to a transport destination different from the transport destination in the first transport command.

In a transport system according to a preferred embodiment of the present invention, the area controller, when the number of the transport vehicles present within the control area is larger than the predetermined number and the transport vehicle to which the transport command is able to be assigned is present within the control area, may assign the third transport command to the transport vehicle. Thus, the article that was designated to have been conveyed to the transport destination outside the control area by the first transport command is able to be conveyed to the transport destination in the first transport command or the other transport destination outside the control area by the transport vehicle to which the third transport command has been assigned.

Preferred embodiments of the present invention are able to provide transport systems with each of which an article is able to be prevented from being left at a transfer port while significantly reducing a processing load on a host controller.

The above and other elements, features, steps, characteristics and advantages of the present invention will become more apparent from the following detailed description of the preferred embodiments with reference to the attached drawings.

BRIEF DESCRIPTION OF DRAWINGS

FIG. 3 is a side view illustrating a transport vehicle, a transfer port, and a buffer of a transport system according to a preferred embodiment of the present invention.

FIG. 5 is a sequence diagram of a transport system according to a preferred embodiment of the present invention.

FIG. 6 is a sequence diagram of a transport system according to a preferred embodiment of the present invention.

FIG. 7 is a sequence diagram of a transport system according to a preferred embodiment of the present invention.

FIG. 8 is a sequence diagram of a transport system according to a preferred embodiment of the present invention.

DETAILED DESCRIPTION OF THE PREFERRED EMBODIMENTS

The following describes preferred embodiments of the present invention with reference to the accompanying drawings. In the descriptions of the drawings, the same or similar components are denoted by the same symbols, and a duplicate description is omitted. The dimension ratios of the drawings do not necessarily match described ones.

Figure 1:
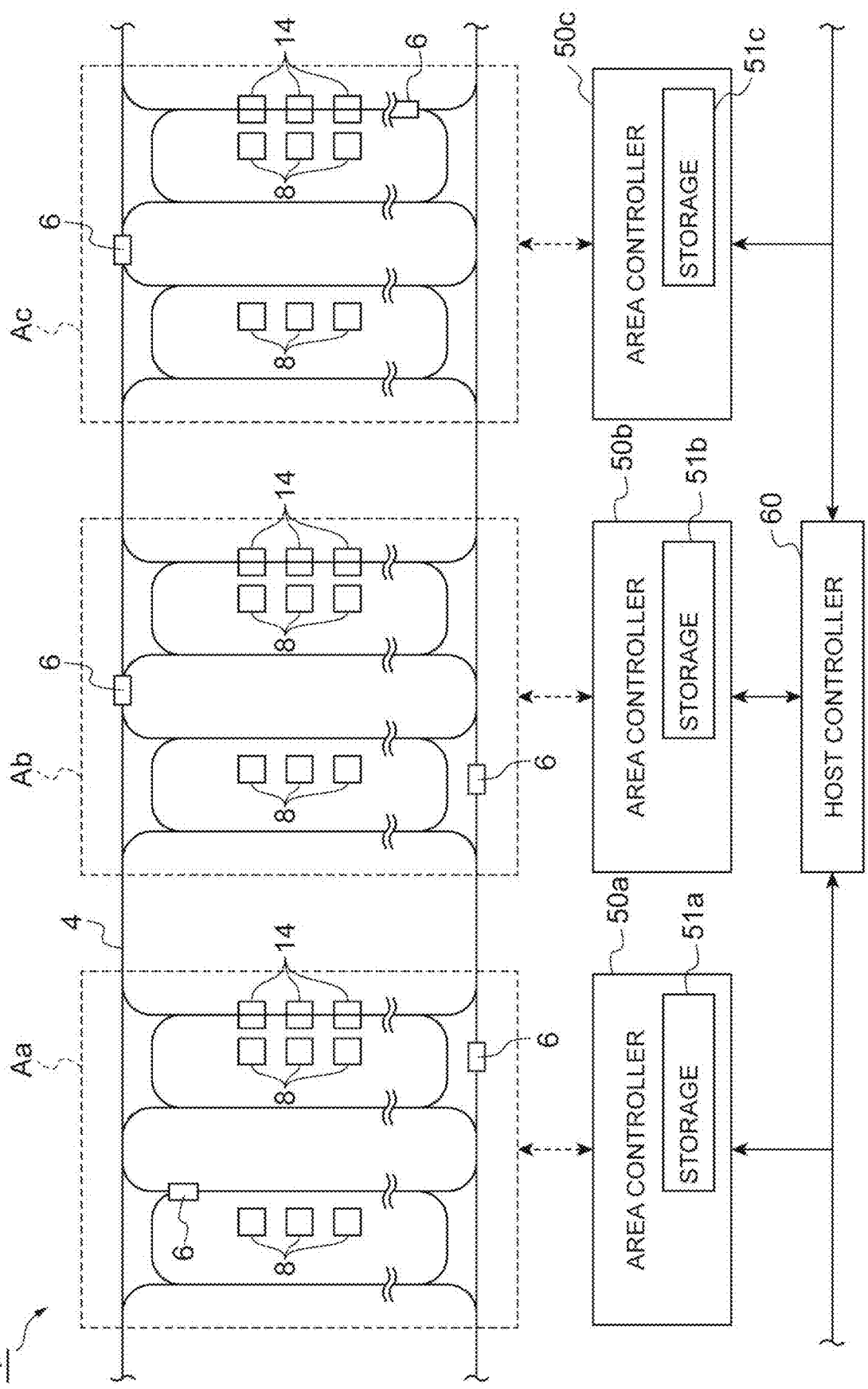
FIG. 1 is a plan view illustrating a transport system according to a preferred embodiment of the present invention.
Figure 2:
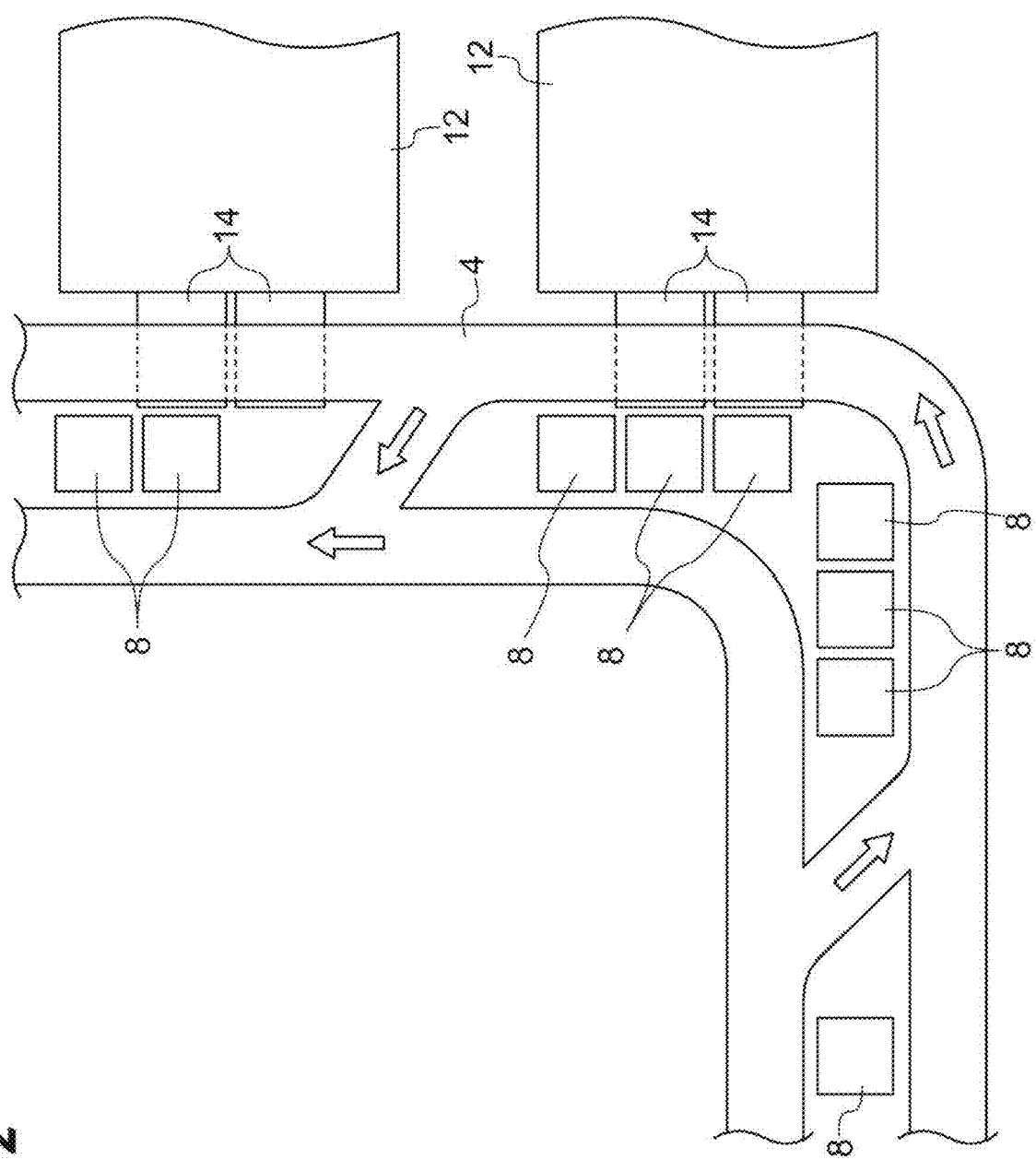
FIG. 2 is a plan view illustrating a portion within an area of a transport system according to a preferred embodiment of the present invention.

As shown in FIG. 1 to FIG. 3, a transport system 1 is a system to convey an article 10. The article 10 may be a container housing a plurality of semiconductor wafers, for example, and may be a glass substrate, a general component, or the like. The transport system 1 includes a track 4, transport vehicles 6, buffers 8, area controllers 50a, 50b, and 50c, and a host controller 60. The transport system 1 conveys the article 10 between a plurality of transfer ports 14 or between a transfer port 14 and a buffer 8 or the like.

The track 4 extends over a plurality of areas Aa, Ab, and Ac. The track 4 is adjacent to or in a vicinity of a ceiling as an overhead space of an operator, for example. The track 4 is hung from the ceiling, for example. The track 4 is a travel path set in advance along which the transport vehicle 6 travels. The track 4 is supported on support pillars 41.

A transport vehicle 6 travels along the track 4 to convey the article 10. Accordingly, the article 10 is able to be transferred. The transport vehicle 6 is a ceiling traveling type unmanned transport vehicle. The transport vehicle 6 is also referred to as a truck (a transport truck), a ceiling traveling vehicle (a ceiling traveling truck), or traveling vehicle (a traveling truck), for example. The number of the transport vehicles 6 included in the transport system 1, which is not limited to a particular number, preferably is a plural number, for example.

As shown in FIG. 3, the transport vehicle 6 includes a travel portion 18 controlling the transport vehicle 6 to travel along the track 4 and a reception communicator 20 receiving power from the track 4 through noncontact power supply, for example. The transport vehicle 6 communicates with any of the area controllers 50a, 50b, and 50c via a power supply line of the track 4 or the like. Alternatively, the transport vehicle 6 may communicate with any of the area controllers 50a, 50b, and 50c via a communication line (a feeder line) provided along the track 4 spaced away from the power supply line. The transport vehicle 6 includes a body frame 22, a cross-feed 24, a θ drive 26, a hoisting-and-lowering driver 28, an elevating platform 30, and a falling prevention cover 33.

The cross-feed 24 collectively cross-feeds the θ drive 26, the hoisting-and-lowering driver 28, and the elevating platform 30 in a direction orthogonal or substantially orthogonal to a travel direction of the track 4. The θ drive 26 rotates at least either the hoisting-and-lowering driver 28 or the elevating platform 30 within a certain angle range within a horizontal plane. The hoisting-and-lowering driver 28 hoists or lowers the elevating platform 30 through winding or unwinding of suspension elements, for example, wires, ropes, and belts. The elevating platform 30 is provided with a chuck and is free to grasp or release the article 10. The falling prevention cover 33 is provided in pairs longitudinally in the travel direction of the transport vehicle 6, for example. The falling prevention cover 33 extends and retracts a nail or the like (not shown) to prevent the article 10 from falling during transport.

The transport vehicle 6 cross-feeds the hoisting-and-lowering driver 28 and the like by the cross-feed 24 and slightly hoists or lowers the elevating platform 30 to transfer the article 10 to and from the buffer 8. The transport vehicle 6 hoists or lowers the elevating platform 30 by the hoisting-and-lowering driver 28 to transfer the article 10 to and from the transfer port 14.

As shown in FIG. 2 and FIG. 3, the buffer 8 is a place at which the article 10 is temporarily placed. The buffer 8 is a stage on which the article 10 is provisionally placed. While the transport vehicle 6 is conveying the article 10 with the transfer port 14 as a destination (a transport destination), when the article 10 being conveyed by the transport vehicle 6 is not able to be transferred to the transfer port 14 because another article 10 is placed on the transfer port 14, for example, the transport vehicle 6 transfers the article 10 to the buffer 8 adjacent to or in a vicinity of the transfer port 14. Thus, the article 10 is temporarily stored at the buffer 8 until the transfer port 14 becomes unoccupied. The buffers 8 are hung from the ceiling or the like with pillars 9. The buffers 8 are provided at positions to and from which the transport vehicle 6 is able to transfer the article 10. The buffers 8 are located beside the track 4. Alternatively, the buffers 8 may be located immediately below the track 4. The buffer 8 is provided with a buffer storage storing various types of information on the buffer 8 (information on whether the article 10 is placed, information on an ID of the placed article 10, and the like) and a communicator communicating the various types of information stored in the buffer storage.

The transfer port 14 is a port to transfer the article 10 to and from a processing apparatus 12 for semiconductors including a washing apparatus, a film manufacturing apparatus, a lithography apparatus, an etching apparatus, a heat treatment apparatus, and a flattening apparatus. The transfer port 14 is a stage on which the article 10 is placed. In a mode in which the article 10 is the container housing the semiconductor wafers, the semiconductor wafers are taken out of the article 10 placed on the transfer port 14 to be taken in into the processing apparatus 12, are subjected to processing in the processing apparatus 12, and are again housed in the article 10. The article 10 housing the semiconductor wafers is conveyed to the transfer port 14 performing transfer to and from another processing apparatus 12 by the transport vehicle 6. The processing apparatus 12 communicates various types of information with the host controller 60 through wired communication via the communication line or the like provided along the track 4 or wireless communication. The processing apparatus 12, which is not limited to a particular apparatus, may be various types of apparatuses. The transfer ports 14 are provided at positions to and from which the transport vehicle 6 is able to transfer the article 10. The transfer ports 14 are located immediately below the track 4. Alternatively, the transfer ports 14 may be located beside and below the track 4; in this case, the transport vehicle 6 cross-feeds the hoisting-and-lowering driver 28 and the like by the cross-feed 24 and hoists or lowers the elevating platform 30 to transfer the article 10 to and from the transfer port 14.

The area controllers 50a, 50b, and 50c are each an electronic controller including a central processing unit (CPU), a read only memory (ROM), and a random access memory (RAM). The area controllers 50a, 50b, and 50c may be implemented as software with a computer program stored in the ROM loaded onto the RAM and executed by the CPU, for example. The area controllers 50a, 50b, and 50c may be implemented as hardware by an electronic circuit or the like.

The area controllers 50a, 50b, and 50c are provided in the areas Aa, Ab, and Ac, respectively. The area controllers 50a, 50b, and 50c are provided corresponding to the areas Aa, Ab, and Ac, respectively. Specifically, the area controllers 50a, 50b, and 50c include the areas Aa, Ab, and Ac, respectively, as control areas as areas the control of which is taken charge of by themselves. In other words, one area controller includes one area as the control area, and the same number of area controllers as that of the areas are provided. That is, one area controller includes any of the areas as the control area. The area controller 50a communicates with the transport vehicles 6 within a control area of the area controller 50a (hereinafter, also referred to as "its own control area") to control the transport vehicles 6 within its own control area. The area controller 50b communicates with the transport vehicles 6 within its own control area to control the transport vehicles 6 within its own control area. The area controller 50c communicates with the transport vehicles 6 within its own control area to control the transport vehicles 6 within its own control area. The area controllers 50a, 50b, and 50c perform wired or wireless communication with the host controller 60. The area controllers 50a, 50b, and 50c include storages 51a, 51b, and 51c, respectively.

The host controller 60 is an electronic controller including a CPU, a ROM, and a RAM. The host controller 60 may be implemented as software with a computer program stored in the ROM loaded onto the RAM and executed by the CPU, for example. The host controller 60 may be implemented as hardware by an electronic circuit or the like. The host controller 60 performs wired or wireless communication with any of the area controllers 50a, 50b, and 50c to transmit to any of the area controllers 50a, 50b, and 50c a transport command controlling the transport vehicle 6 to convey the article 10. The host controller 60 is also connected to a controller controlling a stacker crane installed in a stocker, a controller controlling a conveyor, and the like apart from the area controllers 50a, 50b, and 50c, for example, and transmits various types of commands to the controllers.

In the transport system 1 of the present preferred embodiment, each of the area controllers 50a, 50b, and 50c, when the number of the transport vehicles 6 present within its own control area is a predetermined number and when receiving a first transport command from the host controller 60, stores the first transport command as a command to be managed by itself in each of the storages 51a, 51b, and 51c and transmits a report that the first transport command is not able to be assigned to the transport vehicle 6 (hereinafter, referred to as an "assignment impossibility report") to the host controller 60.

The predetermined number is set in advance. The predetermined number, which is not limited to a particular number, may be a fixed value or a variable value. The predetermined number may be various numbers. The predetermined number is a minimum kept transport vehicle number (a minimum number) as the number of the transport vehicles 6 to be kept within one area, for example. When work to be executed by the transport vehicle 6 within an area, for example, transport of the article 10, occurs, if a sufficient number of the transport vehicles 6 are not present within the area in advance, the work is not able to be executed quickly. In the transport system 1, the minimum kept transport vehicle number as a lower limit value of the number of the transport vehicles 6 to be kept within one area is set, for example, and each of the area controllers 50a, 50b, and 50c controls the transport vehicles 6 within the control area to prevent the number of the transport vehicles 6 within the control area from becoming less than the minimum kept transport vehicle number (that is, the number of the transport vehicles 6 within the control area is controlled to be constantly not less than the minimum kept transport vehicle number). Specifically, when the number of the transport vehicles 6 within the control area is the minimum kept transport vehicle number, each of the area controllers 50a, 50b, and 50c controls travel of the transport vehicles 6 within the control area to prevent the transport vehicles 6 within the control area from leaving the control area.

The first transport command is a command to convey the article 10 from the transfer port 14 within the control area of an area controller to a transport destination outside the area controller. The first transport command is a transport command to convey the article 10 from the transfer port 14 within the area Aa to the transfer port 14 within the area Ab (or within the area Ac), for example. The transport destination, which is not limited to a particular destination, includes the transfer port 14 and the buffer 8 in another area (another control area) different from the area to which the transfer port 14 as a transport source belongs (its own control area).

When the number of the transport vehicles 6 present within the control area of the area controller 50a is the minimum kept transport vehicle number and the area controller 50a receives the first transport command from the host controller 60, for example, if the first transport command is assigned to the transport vehicle 6 within the control area, the transport vehicle 6 to which the first transport command has been assigned will leave of the control area, and thus the number of the transport vehicles 6 present within its own control area becomes less than the minimum kept transport vehicle number. Thus, the area controller 50a is not able to assign the first transport command to any of the transport vehicles 6 within the control area. Accordingly, the area controller 50a stores the first transport command as a command to be managed by itself in the storage 51a and transmits the assignment impossibility report to the host controller 60.

The host controller 60, when receiving the assignment impossibility report from any of the area controllers 50a, 50b, and 50c, when the transport vehicle 6 within the control area of any of the area controllers 50a, 50b, and 50c is provided at a position that is able to transfer the article 10 and the buffer 8 that is able to place thereon the article 10 (hereinafter, referred to as a "vacant buffer 8") is present, generates a second transport command. The second transport command is a command to convey the article 10 from the transfer port 14 within the control area of any of the area controllers 50a, 50b, and 50c to the vacant buffer 8. A transport source of the second transport command is the transfer port 14 the same as the transport source of the first transport command. In the mode in which the article 10 is the container housing the semiconductor wafers, when the article 10 housing processed semiconductor wafers (that is, the article 10 to be carried out) is placed on the transfer port 14, another article 10 is not able to be placed on the transfer port 14, and thus the processing apparatus 12, even though it is in an operable state, is not able to perform processing on the semiconductor wafers housed within the other article 10. Thus, the article 10 placed on the transfer port 14 should be quickly removed from the transfer port 14. In the transport system 1, when the first transport command is not able to be assigned to any of the transport vehicles 6 within the control area, the second transport command with the transfer port 14 the same as the transport source of the first transport command as the transport source is generated, and the second transport command is assigned to the transport vehicle 6, and the article 10 placed on the transfer port 14 is carried out without waiting until the number of the transport vehicles 6 within the control area exceeds the predetermined number. The second transport command is able to be generated based on the first transport command. The second transport command is a command provided by dividing the first transport command (including a portion of the first transport command) and is a command including a carrying-out process from the transport source in the first transport command.

After generating the second transport command, the host controller 60 transmits the second transport command to any of the area controllers 50a, 50b, and 50c. The host controller 60, when receiving the assignment impossibility report from any of the area controllers 50a, 50b, and 50c, when the vacant buffer 8 within the control area of any of the area controllers 50a, 50b, and 50c is present, transmits a command to delete the first transport command stored in its storage (the storage of any of the area controllers 50a, 50b, and 50c) (hereinafter, referred to as a "deletion command") to any of the area controllers 50a, 50b, and 50c. On the other hand, the host controller 60, when receiving the assignment impossibility report from any of the area controllers 50a, 50b, and 50c, when the vacant buffer 8 is not present within the control area of any of the area controllers 50a, 50b, and 50c, does not transmit the deletion command to any of the area controllers 50a, 50b, and 50c. That is, without performing any additional processing on the first transport command transmitted to any of the area controllers 50a, 50b, and 50c, the host controller 60 waits until an assignment report about the first transport command is received from any of the area controllers 50a, 50b, and 50c.

Each of the area controllers 50a, 50b, and 50c, when storing the first transport command in each of the storages 51a, 51b, and 51c, when the number of the transport vehicles 6 present within its own control area is larger than the predetermined number and a vacant transport vehicle 6 (the transport vehicle 6 to which the transport command is able to be assigned) is present within its own control area, assigns the first transport command to the vacant transport vehicle 6. That is, while the number of the transport vehicles 6 present within its own control area is the predetermined number, the stored first transport command is held without being assigned to any of the transport vehicles 6; when the number of the transport vehicles 6 within the control area becomes larger than the predetermined number after a new transport vehicle 6 enters the control area from another area, for example, the stored first transport command is assigned to any vacant transport vehicle 6 within the control area. Thus, the transport vehicle 6 to which the first transport command has been assigned conveys the article 10 from the transfer port 14 within its own control area to a transport destination outside its own control area.

Each of the area controllers 50a, 50b, and 50c, when the vacant transport vehicle 6 (that is, the transport vehicle 6 to which the transport command is able to be assigned) is not present within its own control area, stores the transport command received from the host controller 60 in each of the storages 51a, 51b, and 51c without being assigned to any of the transport vehicles 6. A case in which all the transport vehicles 6 present within its own control area are already executing the transport command corresponds to this case, for example. A plurality of transport commands that are not assigned to any of the transport vehicles 6 are able to be accumulated in the storages 51a, 51b, and 51c. Each of the area controllers 50a, 50b, and 50c, when the vacant transport vehicle 6 occurs within its own control area, assigns the transport commands stored in each of the storages 51a, 51b, and 51c to the vacant transport vehicle 6 in order of their storage, for example.

Each of the area controllers 50a, 50b, and 50c, when receiving the second transport command from the host controller 60, assigns the second transport command to the vacant transport vehicle 6. Thus, the transport vehicle 6 to which the second transport command has been assigned conveys the article 10 from the transfer port 14 within its own control area to the buffer 8. Accordingly, the transport vehicle 6 to which the second transport command has been assigned does not leave of the control area, and thus the number of the transport vehicles 6 within the control area is kept at at least the predetermined number.

The host controller 60, when transport of the article 10 to the buffer 8 within the control area is completed by the transport vehicle 6 to which the second transport command has been assigned, generates a third transport command. The third transport command is a command to convey the article 10 from the buffer 8 within the control area to a transport destination outside the control area. The transport destination of the third transport command may be the same as the transport destination of the first transport command or different therefrom. The third transport command is able to be generated based on the first transport command. The third transport command may be a command provided by dividing the first transport command (including the other portion of the first transport command) and may be a command including a carrying-in process to the transport destination in the first transport command. After generating the third transport command, the host controller 60 transmits the third transport command to any of the area controllers 50a, 50b, and 50c controlling the control area.

Each of the area controllers 50a, 50b, and 50c, when receiving the third transport command from the host controller 60, stores the third transport command in each of the storages 51a, 51b, and 51c. Each of the area controllers 50a, 50b, and 50c, when the third transport command is stored, when the number of the transport vehicles 6 present within its own control area is larger than the predetermined number and the vacant transport vehicle 6 (the transport vehicle 6 to which the transport command is able to be assigned) is present within its own control area, assigns the stored third transport command to the vacant transport vehicle 6. Thus, the transport vehicle 6 to which the third transport command has been assigned conveys the article 10 from the buffer 8 within its own control area to the transport destination outside its own control area. Each of the area controllers 50a, 50b, and 50c, when receiving the third transport command from the host controller 60, for example, stores the third transport command in each of the storages 51a, 51b, and 51c regardless of the number of the transport vehicles 6 present within its own control area being the predetermined number or being larger than the predetermined number. That is, even when the number of the transport vehicles 6 present within the control area is the predetermined number, the assignment impossibility report is not transmitted to the host controller 60. In other words, a new transport command with the buffer 8 as a transport source and with another buffer 8 within the control area as a transport destination is not necessarily required to be generated. When the number of the transport vehicles 6 present within the control area is the predetermined number, for example, the third transport command stored in each of the storages 51a, 51b, and 51c is held without being assigned to any of the transport vehicles 6; when the number of the transport vehicles 6 within the control area becomes larger than the predetermined number, the third transport command stored in each of the storages 51a, 51b, and 51c is assigned to any transport vehicle 6 within the control area.

The following specifically describes exemplary processing executed by the transport system 1 with reference to sequence diagrams in FIG. 4 to FIG. 8.

The following describes the area controller 50a as one of the area controllers 50a, 50b, and 50c. The following describes the transfer port 14 and the processing apparatus 12 present within the control area of the area controller 50a simply as "the transfer port 14 and the processing apparatus 12."

Figure 4:
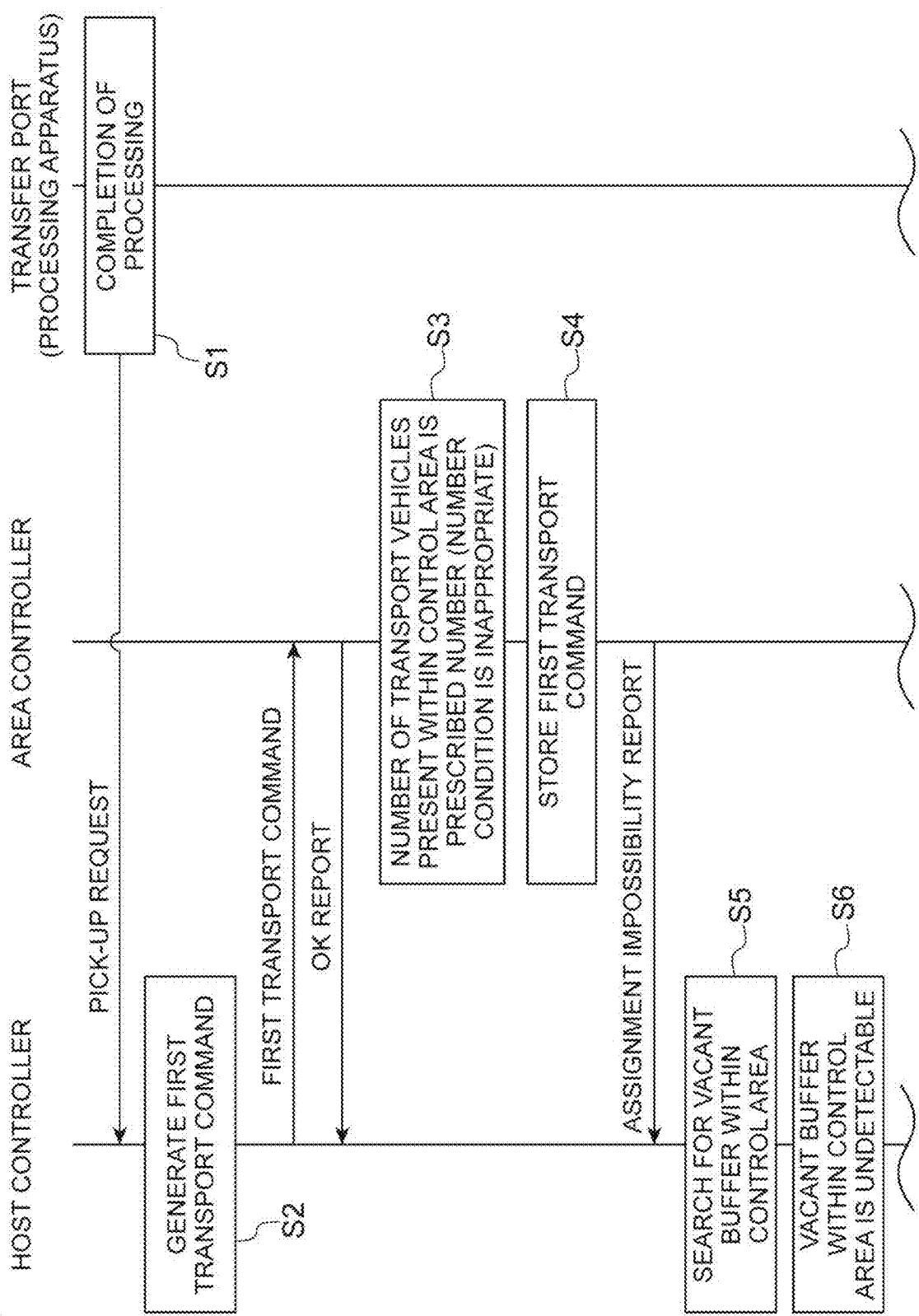
FIG. 4 is a sequence diagram of a transport system according to a preferred embodiment of the present invention.

As shown in FIG. 4, the processing apparatus 12, when completing processing, transmits a pick-up request requesting pick-up (carrying out) of the article 10 from the transfer port 14 to the host controller 60 (Step S1). The host controller 60, in response to reception of the pick-up request, generates the first transport command to convey the article 10 from the transfer port 14 within the control area of the area controller 50a to a transport destination outside the control area of the area controller 50a (Step S2). The host controller 60 transmits the first transport command to the area controller 50a.

The area controller 50a, in response to reception of the first transport command, returns an OK report reporting the reception to the host controller 60. The area controller 50a determines whether the number of the transport vehicles 6 present within its own control area is the predetermined number based on a communication result with the transport vehicles 6, for example. When determining that the number of the transport vehicles 6 present within its own control area is the predetermined number, the area controller 50a determines a number condition of the transport vehicles 6 to be inappropriate (Step S3). The area controller 50a stores the received first transport command in the storage Ma (Step S4). The area controller 50a transmits an assignment impossibility report to the host controller 60.

The host controller 60, when receiving the assignment impossibility report, searches for the vacant buffer 8 within the control area of the area controller 50a (Step S5). Search for the vacant buffer 8 is able to be executed based on various types of information determined or received by performing communication with the buffers 8 within the control area, for example. When the vacant buffers 8 is not present within the control area, the host controller 60 determines that the vacant buffer 8 is undetectable (Step S6).

Subsequently, the area controller 50a, when the transport vehicle 6 enters its own control area, for example, and the number of the transport vehicles 6 present within its own control area increases, determines that the number of the transport vehicles 6 present within its own control area is larger than the predetermined number and determines that the number condition of the transport vehicles 6 is OK as shown in FIG. 5 (Step S11). The area controller 50a, when the vacant transport vehicle 6 is present within its own control area, assigns the first transport command stored in the storage 51a to the vacant transport vehicle 6 (Step S12). The area controller 50a transmits a command assignment report reporting that the first transport command has been assigned to the transport vehicle 6 to the host controller 60. The transport vehicle 6 to which the first transport command has been assigned carries out (picks up) the article 10 from the transfer port 14 in order to convey it to the transport destination outside the control area. The transport vehicle 6 that has carried out the article 10 from the transfer port 14 reports the fact to the area controller 50a, and the area controller 50a recognizes that pick-up of the article 10 from the transfer port 14 has been completed (Step S13). The processing apparatus 12 recognizes that the transfer port 14 is in a state of vacancy (the article 10 is not placed). The processing apparatus 12 transmits a drop-off request requesting the transfer port 14 to place the article 10 to the host controller 60 (Step S14).

On the other hand, as shown in FIG. 6, the host controller 60, when the vacant buffer 8 is present within the control area of the area controller 50a after searching for the vacant buffer 8 at Step S5, determines that the vacant buffer 8 is detectable (Step S21). As shown in FIG. 7, the host controller 60 transmits the deletion command to delete the first transport command stored in the storage 51a to the area controller 50a. The area controller 50a, in response to reception of the deletion command, returns an OK report reporting the reception to the host controller 60. The area controller 50*a* deletes the first transport command stored in the storage 51*a* (Step S22). The area controller 50*a* transmits a deletion completion report reporting deletion completion of the first transport command to the host controller 60.

The host controller 60 generates the second transport command to convey the article 10 from the transfer port 14 to the vacant buffer 8 (Step S23). The host controller 60 transmits the second transport command to the area controller 50*a*. The area controller 50*a* assigns the received second transport command to the vacant transport vehicle 6 (Step S24). The area controller 50*a* transmits a command assignment report reporting that the second transport command has been assigned to the transport vehicle 6 to the host controller 60. The transport vehicle 6 to which the second transport command has been assigned carries out the article 10 from the transfer port 14 in order to convey it to the vacant buffer 8 within the control area. The transport vehicle 6 that has carried out the article 10 from the transfer port 14 reports the fact to the area controller 50*a*, and the area controller 50*a* recognizes that pick-up of the article 10 from the transfer port 14 has been completed (Step S25). The processing apparatus 12 recognizes that the transfer port 14 is in a state of vacancy (the article 10 is not placed). The processing apparatus 12 transmits a drop-off request requesting the transfer port 14 to place the article 10 to the host controller 60 (Step S26).

As shown in FIG. 8, the area controller 50*a* recognizes that transport of the article 10 to the vacant buffer 8 has been completed (Step S31). The area controller 50*a* transmits a transport completion report reporting that transport by the second transport command has been completed to the host controller 60. The host controller 60 generates the third transport command to convey the article 10 from the buffer 8 to the transport destination outside the control area of the area controller 50*a* (Step S32). The host controller 60 transmits the third transport command to the area controller 50*a*. The area controller 50*a* stores the received third transport command in the storage 51*a* (Step S33).

Subsequently, the area controller 50*a*, when the transport vehicle 6 enters its own control area, for example, and the number of the transport vehicles 6 present within its own control area increases, determines that the number of the transport vehicles 6 present within its own control area is larger than the predetermined number and determines that the number condition of the transport vehicles 6 is OK (Step S34). The area controller 50*a*, when the vacant transport vehicle 6 is present within its own control area, assigns the third transport command stored in the storage 51*a* to the vacant transport vehicle 6 (Step S35). The area controller 50*a* transmits a command assignment report reporting that the third transport command has been assigned to the transport vehicle 6 to the host controller 60. The transport vehicle 6 to which the third transport command has been assigned carries out the article 10 from the buffer 8 in order to convey it to the transport destination outside the control area. The transport vehicle 6 that has carried out the article 10 from the buffer 8 reports the fact to the area controller 50*a*, and the area controller 50*a* recognizes that pick-up of the article 10 from the buffer 8 has been completed (Step S36).

In the transport system 1, in each of the area controllers 50*a*, 50*b*, and 50*c*, when the number of the transport vehicles 6 present within its own control area is the predetermined number, when the vacant buffer 8 is present within its own control area, the first transport command is deleted. Subsequently, the second transport command is transmitted from the host controller 60 to each of the area controllers 50*a*, 50*b*, and 50*c*. On the other hand, when the vacant buffer 8 is not present within its own control area, in each of the area controllers 50*a*, 50*b*, and 50*c*, the first transport command remains stored. Thus, while the number of the transport vehicles 6 present within the control area is prevented from becoming less than the predetermined number, the command to convey the article 10 from the transfer port 14 within the control area is able to be managed by either the host controller 60 or each of the area controllers 50*a*, 50*b*, and 50*c* regardless of the presence or absence of the vacant buffer 8 within the control area, and thus the host controller 60 does not need to constantly monitor the presence or absence of the vacant buffer 8.

As described above, the host controller 60 transmits various types of commands to various controllers, not only to the area controllers 50*a*, 50*b*, and 50*c*, for example. Thus, a processing load on the host controller 60 is preferably reduced. In the transport system 1 of the present preferred embodiment, the host controller 60, when receiving the assignment impossibility report from each of the area controllers 50*a*, 50*b*, and 50*c*, searches once for the vacant buffer 8 within the control area of each of the area controllers 50*a*, 50*b*, and 50*c*, which provides a smaller processing load than one involving constant monitoring until the vacant buffer 8 occurs within the control area. Accordingly, while the processing load on the host controller 60 is reduced, the article 10 is able to be prevented from being left at the transfer port 14. The article 10 is quickly carried out of the transfer port 14, and thus the operating rate of the processing apparatus 12 is able to be improved. An article swap time (a time from when the pick-up request is output from the processing apparatus 12 until when the article 10 is picked up from the transfer port 14 and a new article 10 is placed on the transfer port 14) is able to be reduced.

In the transport system 1, each of the area controllers 50*a*, 50*b*, and 50*c*, when storing the first transport command, when the number of the transport vehicles 6 present within its own control area is larger than the predetermined number and the vacant transport vehicle 6 is present within its own control area, assigns the first transport command to the vacant transport vehicle 6. Thus, when the vacant buffer 8 is not present, each of the area controllers 50*a*, 50*b*, and 50*c* continuously manages the first transport command and waits for an increase in the number of the transport vehicles 6 within the control area, and the article 10 is able to be conveyed from the transfer port 14 to the transport destination outside the control area.

In the transport system 1, each of the area controllers 50*a*, 50*b*, and 50*c* assigns the second transport command received from the host controller 60 to the transport vehicle 6. The host controller 60, when receiving the transport completion report of the second transport command, generates the third transport command and transmits the third transport command to each of the area controllers. Thus, the article 10 is conveyed to the vacant buffer 8 within the control area, and then the article 10 is able to be conveyed from the buffer 8 to the transport destination in the first transport destination or the other transport destination outside the control area. That is, the second transport command or the third transport command is able to control the transport vehicle 6 to execute transport of the article 10 that was designated to have been executed by the transport vehicle 6 by the first transport command or transport of the article 10 to a transport destination different from the transport destination in the first transport command.

In the transport system 1, each of the area controllers 50*a*, 50*b*, and 50*c*, when the number of the transport vehicles 6 present within its own control area is larger than the predetermined number and the vacant transport vehicle 6 is present within its own control area, assigns the third transport command to the transport vehicle. Thus, the article 10 that was designated to have been conveyed to the transport destination outside the control area by the first transport command is able to be conveyed to the transport destination in the first transport command or the other transport destination outside the control area by the transport vehicle 6 to which the third transport command has been assigned. In addition, transport of the article 10 from the transfer port 14 (the first transport command) is able to be performed prior to transport of the article 10 from the buffer 8 (the third transport command).

Preferred embodiments of the present invention have been described above. However, the present invention is not limited to the preferred embodiments described above, and various modifications may be implemented within the scope of the present invention.

In a preferred embodiment described above, the layout of the track 4 and the areas Aa, Ab, and Ac is not limited to particular one; various layouts are able to be implemented for the track 4 and the areas Aa, Ab, and Ac. A preferred embodiment described above describes the processing with respect to one area controller 50*a* as an example; similar processing is able to be executed also in the other area controllers 50*b* and 50*c*. The transport system 1 of a preferred embodiment of the present invention may include one or a plurality of controllers relaying the area controllers 50*a*, 50*b*, and 50*c* and the host controller 60. The number of the areas, and thus the number of the area controllers is not limited to a particular number.

In a preferred embodiment of the present invention, the host controller 60 generates and transmits the second transport command after transmitting the deletion command; the host controller 60 may transmit the deletion command after generating and transmitting the second transport command or generate and transmit the second transport command simultaneously with (concurrently with) transmission of the deletion command. In a preferred embodiment of the present invention, each of the area controllers 50*a*, 50*b*, and 50*c*, when receiving the third transport command from the host controller 60, stores the third transport command in each of the storages 51*a*, 51*b*, and 51*c*; in this process, when the number of the transport vehicles 6 present within its own control area is larger than the predetermined number and the vacant transport vehicle 6 is present within its own control area, the received third transport command may be assigned to the vacant transport vehicle 6 (the transport vehicle 6 to which the transport command is able to be assigned). In a preferred embodiment of the present invention, the transport command assigned to or to be assigned to the transport vehicle 6 may be cancelled.

While preferred embodiments of the present invention and modifications to the preferred embodiments have been described above, it is to be understood that variations and modifications will be apparent to those skilled in the art without departing from the scope and spirit of the present invention. The scope of the present invention, therefore, is to be determined solely by the following claims.

The invention claimed is:

1. A transport system comprising:
a track extending over a plurality of areas;
a plurality of transport vehicles to travel along the track;
an area controller including any of the plurality of areas as a control area and configured or programmed to control the plurality of transport vehicles within the control area;
a buffer provided at a position to and from which one of the plurality of transport vehicles within the control areas is able to transfer an article and on which the article is temporarily placed; and
a host controller configured or programmed to transmit to the area controller a transport command to cause the one of the plurality of transport vehicles to convey the article; wherein
the area controller is configured or programmed to, when a number of the plurality of transport vehicles present within the control area is a predetermined number set in advance and when receiving a first transport command to convey the article from a transfer port of the article for a processing apparatus within the control area to a transport destination outside the control area from the host controller, store the first transport command and transmit a report indicating that the first transport command is not able to be assigned to the one of the plurality of transport vehicles to the host controller; and
the host controller is configured or programmed to, when receiving the report from the area controller, when the buffer that is able to place the article is present, transmit a command to delete the stored first transport command to the area controller, generate a second transport command to convey the article from the transfer port to the buffer, and transmit the second transport command to the area controller.

2. The transport system according to claim 1, wherein the area controller is configured or programmed to, when storing the first transport command, when the number of the plurality of transport vehicles present within the control area is larger than the predetermined number and the one of the plurality of transport vehicles to which the transport command is able to be assigned is present within the control area, assign the first transport command to the transport vehicle.

3. The transport system according to claim 1, wherein
the area controller is configured or programmed to assign the second transport command received from the host controller to the one of the plurality of transport vehicle; and
the host controller is configured or programmed to, when transport of the article to the buffer is completed by the one of the plurality of transport vehicles to which the second transport command has been assigned, generate a third transport command to convey the article from the buffer to a transport destination in the first transport command or another transport destination outside the control area and transmit the third transport command to the area controller.

4. The transport system according to claim 3, wherein the area controller is configured or programmed to, when the number of the transport vehicles present within the control area is larger than the predetermined number and the transport vehicle to which the transport command is able to be assigned is present within the control area, assign the third transport command to the transport vehicle.

5. The transport system according to claim 2, wherein
the area controller is configured or programmed to assign the second transport command received from the host controller to the one of the plurality of transport vehicles; and
the host controller is configured or programmed to, when transport of the article to the buffer is completed by the one of the plurality of transport vehicles to which the second transport command has been assigned, generate a third transport command to convey the article from the buffer to a transport destination in the first transport command or another transport destination outside the control area and transmit the third transport command to the area controller.

6. The transport system according to claim 5, wherein the area controller is configured or programmed to, when the number of the transport vehicles present within the control area is larger than the predetermined number and the transport vehicle to which the transport command is able to be assigned is present within the control area, assign the third transport command to the transport vehicle.

* * * * *